(12) United States Patent
 Choi et al.

(10) Patent No.: US 10,726,886 B2
(45) Date of Patent: Jul. 28, 2020

(54) MEMORY CIRCUITS PRECHARGING MEMORY CELL ARRAYS AND MEMORY DEVICES INCLUDING THE SAME

(71) Applicant: Samsung Electronics Co., Ltd., Suwon-si, Gyeonggi-do (KR)

(72) Inventors: Jin-Yong Choi, Seoul (KR); Sang-Yun Kim, Hwaseong-si (KR); Soo-Bong Chang, Incheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/011,662

(22) Filed: Jun. 19, 2018

(65) Prior Publication Data

US 2019/0147925 A1    May 16, 2019

(30) Foreign Application Priority Data

Nov. 10, 2017  (KR) .......................... 10-2017-0149794

(51) Int. Cl.

| G11C 7/12 | (2006.01) |
|---|---|
| G11C 11/4091 | (2006.01) |
| G11C 7/06 | (2006.01) |
| G11C 7/18 | (2006.01) |
| G11C 11/4094 | (2006.01) |
| G11C 11/4097 | (2006.01) |

(52) U.S. Cl.
CPC .................. *G11C 7/12* (2013.01); *G11C 7/06* (2013.01); *G11C 7/18* (2013.01); *G11C 11/4091* (2013.01); *G11C 11/4094* (2013.01); *G11C 11/4097* (2013.01); *G11C 2207/12* (2013.01)

(58) Field of Classification Search
CPC ......... G11C 7/12; G11C 11/4094; G11C 7/18; G11C 7/06; G11C 11/4091; G11C 2207/12; G11C 11/4097
See application file for complete search history.

(56) References Cited

U.S. PATENT DOCUMENTS

| 5,986,474 | A | 11/1999 | Chung et al. |
|---|---|---|---|
| 6,028,803 | A | 2/2000 | Kopley et al. |
| 6,205,068 | B1 * | 3/2001 | Yoon .................. G11C 7/12 |
|  |  |  | 365/203 |
| 6,466,501 | B2 | 10/2002 | Kim et al. |
| 6,888,767 | B1 | 5/2005 | Han |
| 7,307,907 | B2 | 12/2007 | Houston |
| 8,116,146 | B2 | 2/2012 | Chi |
| 8,279,686 | B2 | 10/2012 | Hsu et al. |

(Continued)

FOREIGN PATENT DOCUMENTS

KR          10-0483003          4/2005

*Primary Examiner* — Jerome Leboeuf
(74) *Attorney, Agent, or Firm* — Myers Bigel, P.A.

(57) ABSTRACT

A memory circuit and a memory device including the same are provided. The memory circuit may be connected to a bit line and a complementary bit line and configured to perform precharging on the bit line and the complementary bit line. The memory circuit may include: an equalizer configured to equalize voltage levels of the bit line and the complementary bit line by connecting the bit line with the complementary bit line in response to an equalizing signal; and a precharger configured to precharge the bit line and the complementary bit line to a precharge voltage in response to a precharge signal. The equalizing signal and the precharge signal may be received via separate lines.

13 Claims, 11 Drawing Sheets

(56) References Cited

U.S. PATENT DOCUMENTS

| | | |
|---|---|---|
| 8,605,529 B2 | 12/2013 | Katoch et al. |
| 9,269,420 B2 | 2/2016 | Chun et al. |
| 9,478,265 B2 | 10/2016 | Lee et al. |
| 9,646,659 B2 | 5/2017 | Kim |
| 2005/0105372 A1 | 5/2005 | Kanda |
| 2005/0265096 A1* | 12/2005 | Obara ................ G11C 7/12 365/203 |
| 2006/0215479 A1* | 9/2006 | Lee ................ G11C 7/12 365/230.06 |
| 2010/0165768 A1* | 7/2010 | Won ................ G11C 7/12 365/203 |

* cited by examiner

MEMORY CIRCUITS PRECHARGING MEMORY CELL ARRAYS AND MEMORY DEVICES INCLUDING THE SAME

CROSS-REFERENCE TO RELATED APPLICATION

This application claims the benefit of Korean Patent Application No. 10-2017-0149794, filed on Nov. 10, 2017, in the Korean Intellectual Property Office, the disclosure of which is incorporated herein in its entirety by reference.

TECHNICAL FIELD

The present disclosure relates to a memory circuit and a memory device including the same, and more particularly, to a memory circuit precharging a memory cell array.

BACKGROUND

A memory device may be implemented with a semiconductor such as silicon (Si), germanium (Ge), gallium arsenide (GaAs), and indium phosphide (InP). The memory device may be classified as a volatile memory device or a nonvolatile memory device.

A nonvolatile memory device is a memory device in which data stored therein does not disappear even when power supply is interrupted. Example nonvolatile memory devices may include a NAND flash memory, a vertical NAND flash memory, a NOR flash memory, resistive random-access memory (RAM) (RRAM), a phase-change memory, magnetoresistive RAM (MRAM), and the like.

A volatile memory device is a memory device in which data stored therein disappears when power supply is interrupted. Example volatile memory devices may include static RAM (SRAM), dynamic RAM (DRAM), a latch, a flip-flop, a register, and the like.

In DRAM, a memory cell array may include bit lines and memory cells connected to a complementary bit line. When a read operation (or a refresh operation) is performed, a bit line sense amplifier may sense and amplify a voltage difference between the bit line and the complementary bit line. The bit line sense amplifier may include a plurality of transistors. As a result of refinement of a manufacturing process, a thickness of a gate-oxide layer of the plurality of transistors has been reduced. However, as the thickness of the gate oxide layer of the plurality of transistors is reduced, a problem occurs in that a gate leakage current is increased in response to an applied voltage.

SUMMARY

The inventive concepts of the present disclosure provide a memory circuit capable of reducing a gate leakage current of a bit line sense amplifier in a precharge process of a memory cell array.

The inventive concepts also provide a memory device capable of reducing the gate leakage current of the bit line sense amplifier in the precharge process of the memory cell array.

According to an aspect of the inventive concepts, a memory circuit is provided. The memory circuit may be connected to a bit line and a complementary bit line and may be configured to perform precharging on the bit line and the complementary bit line. The memory circuit may include: an equalizer configured to equalize voltage levels of the bit line and the complementary bit line by connecting the bit line with the complementary bit line in response to an equalizing signal; and a precharger configured to precharge the bit line and the complementary bit line to a precharge voltage in response to a precharge signal. The equalizing signal and the precharge signal may be received via separate lines.

According to another aspect of the inventive concepts, a volatile memory device is provided. The volatile memory device may include: a memory cell array connected to a bit line and a complementary bit line, and including a plurality of memory cells; a bit line sense amplifier configured to sense and amplify signals of the bit line and the complementary bit line; and a precharge manager configured to output an equalizing signal and a precharge signal to the bit line sense amplifier via separate lines. The bit line sense amplifier may include an equalizer configured to equalize the bit line and the complementary bit line by electrically connecting the bit line with the complementary bit line in response to the equalizing signal, and a precharger configured to precharge the bit line and the complementary bit line to a precharge voltage in response to the precharge signal.

According to another aspect of the inventive concepts, an operation method of a memory circuit configured to perform precharging on a bit line and a complementary bit line is provided. The operation method may include: equalizing the bit line and the complementary bit line by electrically connecting the bit line with the complementary bit line during a first period in response to an equalizing signal of a first voltage level; and precharging the bit line and the complementary bit line to a precharge voltage during a second period in response to a precharge signal of a second voltage level, wherein the first period is a time from a first time point at which a precharge command is received to a second time point at which the bit line and the complementary bit line reach an identical voltage level due to the equalizing; the second period is a time from the first time point to a third time point at which an active command for the bit line and the complementary bit line is received; and the first voltage level is greater than the second voltage level.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
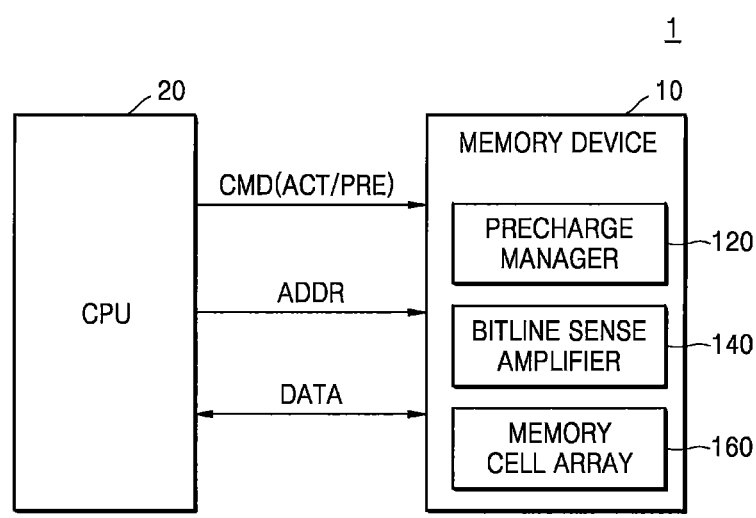
FIG. 1 is a block diagram illustrating a memory system according to aspects of the present disclosure.

FIG. 1 is a block diagram illustrating a memory system 1 according to aspects of the present disclosure.

Referring to FIG. 1, the memory system 1 may include a memory device 10 and a central processing unit (CPU) 20.

The central processing unit 20 may provide various signals to the memory device 10 via a memory interface (not shown) so as to control memory operations such as write and read. For example, the central processing unit 20 may access data DATA of a memory cell array 160 by providing a command CMD and an address ADDR to the memory device 10. The command CMD may include an active command ACT for normal memory operations such as data write and data read, and a precharge command PRE. The active command ACT may denote a command to switch a state of the memory cell array 160 to an active state so as to write data DATA into the memory cell array 160 or to read data DATA from the memory cell array 160, and in the active state, the memory cell included in the memory cell array 160 may be driven. In addition, the precharge command PRE may denote a command to switch the state of the memory cell array 160 from the active state to a standby state after the data write or read is complete. The central processing unit 20 may access the memory device 10 in response to a request from a host (not shown).

The memory device 10 may be a storage device based on a semiconductor device. Illustratively, the memory device 10 may be implemented with random-access memories (RAMs) such as dynamic RAM (DRAM), synchronous DRAM (SDRAM), static RAM (SRAM), double data rate SDRAM (DDR SDRAM), DDR2 SDRAM, DDR3 SDRAM, phase-change RAM (PRAM), magnetic RAM (MRAM), and/or resistive RAM (RRAM). The memory device 10 may receive or output the data DATA via the data lines in response to the address ADDR and the command CMD received from the central processing unit 20. The memory device 10 may include a precharge manager 120, a bit line sense amplifier 140, and the memory cell array 160.

The precharge manager 120 may provide various signals to perform precharging in response to the command CMD received from the central processing unit 20 and output the various signals to the bit line sense amplifier 140. According to the some of the inventive concepts of the present disclosure, the precharge manager 120 may provide an equalizing signal and a precharge signal to perform the precharging, and output the provided equalizing signal and the provided precharge signal to the bit line sense amplifier 140 via separate lines. Accordingly, the precharge manager 120 may independently control the equalizing signal and the precharge signal, and reduce current leaked through a gate of a transistor included in the bit line sense amplifier 140.

The bit line sense amplifier 140 may be connected to a bit line connected to the memory cell array 160. The bit line sense amplifier 140 may sense a voltage change of the bit line, amplify the voltage change, and output the amplified voltage change. The bit line sense amplifier 140 according to the the inventive concepts of the present disclosure may receive the equalizing signal and the precharge signal through separate lines from the precharge manager 120, and may perform the precharging on the bit line connected correspondingly. In addition, in some embodiments, the bit line sense amplifier 140 may receive an isolation signal and an offset cancellation signal from a control logic (not shown), and perform an offset removal operation and a pre-sensing operation based on the received isolation signal and the received offset cancellation signal. Illustratively, an offset may denote a difference in characteristics (for example, a threshold voltage) between the elements included in the bit line sense amplifier 140.

The memory cell array 160 may include a plurality of memory cells. Each of the plurality of memory cells may be arranged at a point where a plurality of word lines and a plurality of bit lines intersect. The plurality of memory cells may be connected to the plurality of word lines and the plurality of bit lines. Each of the plurality of memory cells may be provided in a matrix form. The plurality of word lines may be connected to rows of the memory cells of the memory cell array 160. The plurality of bit lines may be connected to columns of the memory cells of the memory cell array 160.

Figure 2:
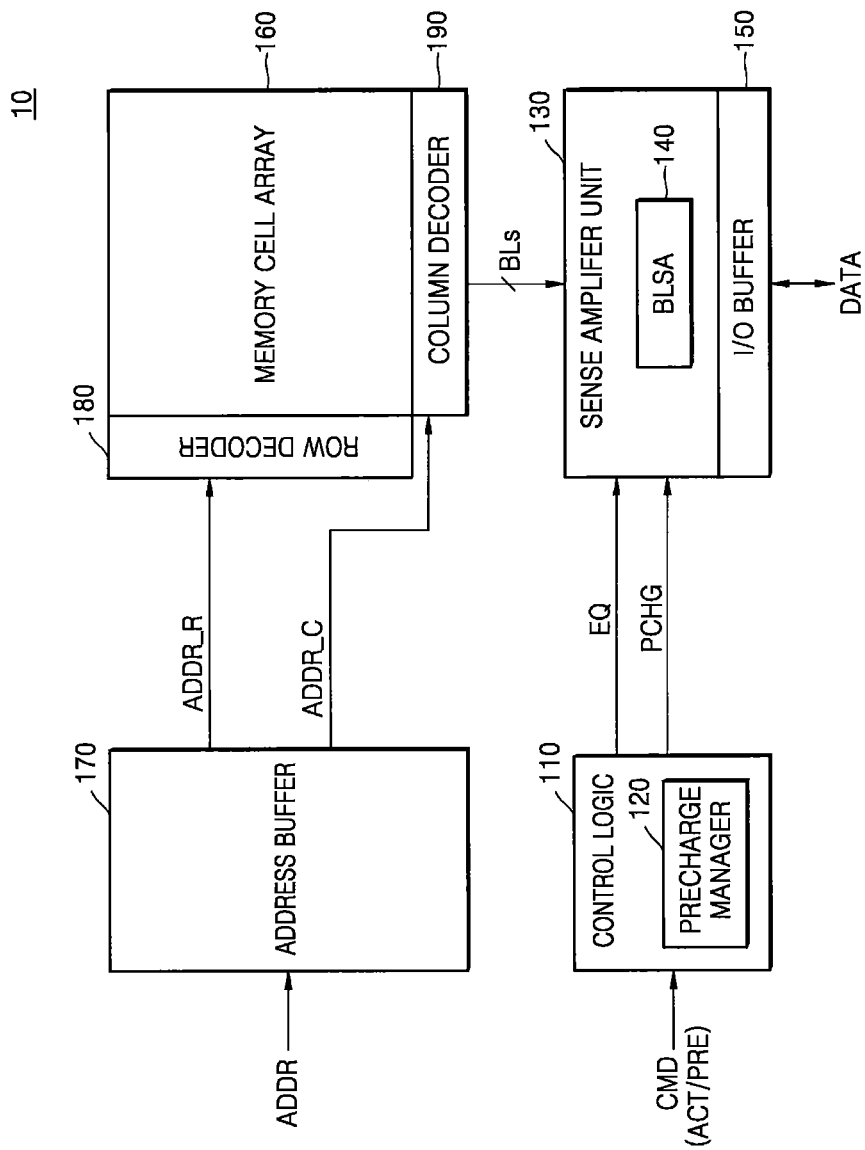
FIG. 2 is a block diagram illustrating a memory device according to aspects of the present disclosure.

FIG. 2 is a block diagram illustrating the memory device 10 according to aspects of the present disclosure. Contents of FIG. 2 overlapping with contents in FIG. 1 will be omitted for brevity.

Referring to FIG. 2, the memory device 10 may include a control logic 110, the precharge manager 120, a sense amplifier 130, the bit line sense amplifier (BLSA) 140, an input/output (I/O) buffer 150, the memory cell array 160, an address buffer 170, a row decoder 180, and a column decoder 190. The precharge manager 120, the bit line sense amplifier 140, and the memory cell array 160 are described above with reference to FIG. 1, and descriptions thereof will be omitted here for brevity.

The control logic 110 may receive the command CMD from the outside or an external device (for example, the central processing unit 20) and provide various signals to control the memory device 10 based on the received command CMD. The precharge manager 120 included in the control logic 110 may receive the precharge command PRE, and may output the equalizing signal EQ and the precharge signal PCHG to the bit line sense amplifier 140 included in the sense amplifier 130 based on the received precharge command PRE. As described herein, according to the the inventive concepts of the present disclosure, the equalizing signal EQ and the precharge signal PCHG may be output to the bit line sense amplifier 140 via separate lines.

The sense amplifier 130 may be connected to the plurality of bit lines BL connected to the memory cell array 160. The sense amplifier 130 may sense a voltage change of an activated bit line among the plurality of bit lines BL, and may amplify and output the sensed voltage change. To this end, the sense amplifier 130 may include the bit line sense amplifier 140 connected to each of the plurality of bit lines BL. The input/output buffer 150 may output data DATA to an external device via data lines DQ based on the voltage change amplified by the sense amplifier 130.

The address buffer 170 may receive the address ADDR from an external device (for example, the central processing unit 20). The address ADDR may include a row address ADDR_R indicating a row of the memory cell array 160 and a column address ADDR_C indicating a column of the memory cell array 160. The address buffer 170 may transmit the row address ADDR_R to the row decoder 180 and the column address ADDR_C to the column decoder 190, based on the address ADDR.

The row decoder 180 may select any one of the plurality of word lines connected to the memory cell array 160. For example, the row decoder 180 may receive the row address ADDR_R from the address buffer 170. The row decoder 180 may select any one of the plurality of word lines corresponding to the received row address ADDR_R among the plurality of word lines. In one example, the row decoder 180 may activate the selected word line in response to a row address strobe signal (not shown).

The column decoder 190 may select any one of a plurality of bit lines BL connected to the memory cell array 160. For example, the column decoder 190 may receive the column address ADDR_C from the address buffer 170. The column decoder 190 may select any one of the bit lines BL corresponding to the received column address ADDR_C among the plurality of bit lines BL. In one example, the column decoder 190 may activate the selected bit line BL in response to a column address strobe signal (not shown).

Figure 3:
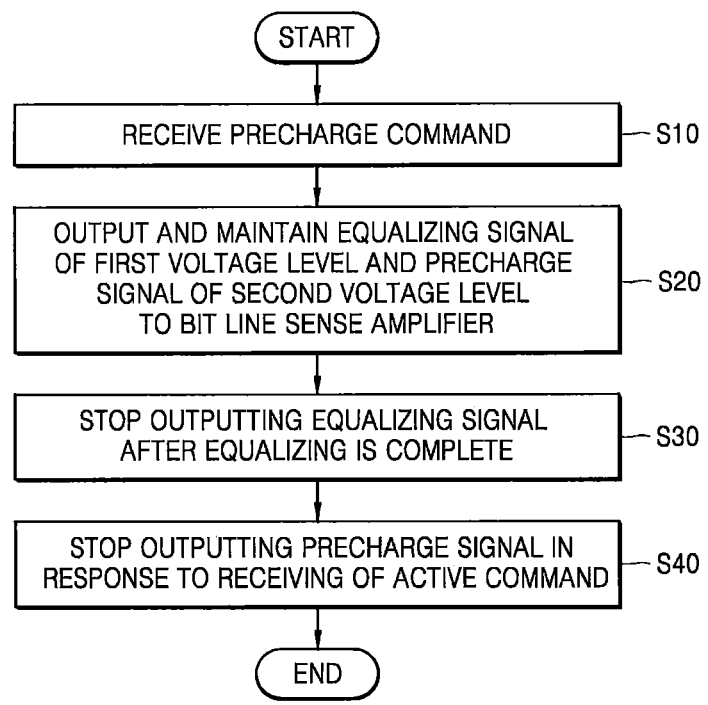
FIG. 3 is a flowchart for explaining an operation method of a precharge manager according to aspects of the present disclosure.

FIG. 3 is a flowchart for explaining an operation method of the precharge manager 120 according to aspects of the present disclosure.

Referring to FIGS. 2 and 3, the precharge manager 120 may receive the precharge command PRE from the outside or an external device (for example, the central processing unit 20 in FIG. 1) (operation S10). The precharge manager 120 may output and maintain the equalizing signal EQ of a first voltage level and the precharge signal PCHG of a second voltage level to the bit line sense amplifier 140 (operation S20). According to some embodiments, the first voltage level may be greater than the second voltage level.

The bit line sense amplifier 140 may perform equalizing in response to the equalizing signal EQ and perform the precharging in response to the precharge signal PCHG. Herein, equalizing may denote an operation of connecting the bit line with the complementary bit line so that the bit line and the complementary bit line have the same voltage level. In addition, precharging may denote an operation of applying and maintaining the precharge voltage commonly to the bit line and the complementary bit line.

The precharge manager 120 may stop outputting of the equalizing signal EQ by lowering the equalizing signal EQ to a logic low level when the equalizing is complete, that is, when the bit line and the complementary bit line have the same voltage level (operation S30). When the precharge manager 120 receives the active command ACT from the outside or external device (for example, the central processing unit 20 in FIG. 1), the precharge manager 120 may stop the outputting of the signal PCHG by lowering the precharge signal PCHG to the logic low level (operation S40).

Figure 4:
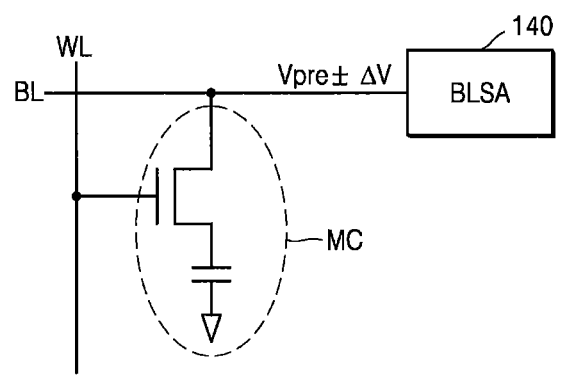
FIG. 4 is a block diagram illustrating a bit line voltage sensing operation of a bit line sense amplifier.

FIG. 4 is a block diagram illustrating a bit line voltage sensing operation of the bit line sense amplifier 140. For convenience of simple explanation, the components other than the bit line sense amplifier 140, the bit line BL, the word line WL, and the memory cell MC will be omitted.

Referring to FIGS. 2 and 4, the memory device 10 may perform a refresh operation based on an amount of charge of a capacitor included in the memory cell MC. For example, the bit line BL connected to the memory cell MC may be precharged to a precharge voltage Vpre. Thereafter, as the word line WL is activated, the charge sharing may be provided between a charge of the bit line BL charged to the precharge voltage Vpre and a charge of the capacitor of the memory cell MC. The voltage of the bit line BL may be decreased or increased by a voltage change amount $\Delta V$ by the charge sharing. The bit line sense amplifier 140 may sense and amplify the voltage change amount $\Delta V$.

The bit line sense amplifier 140 according to the inventive concepts of the present disclosure may reduce the gate leakage current that leaks from the bit line sense amplifier 140 to the bit line BL by controlling the equalizing signal EQ and the precharge signal PCHG based on separate lines and a voltage source in a precharge process.

Figure 5:
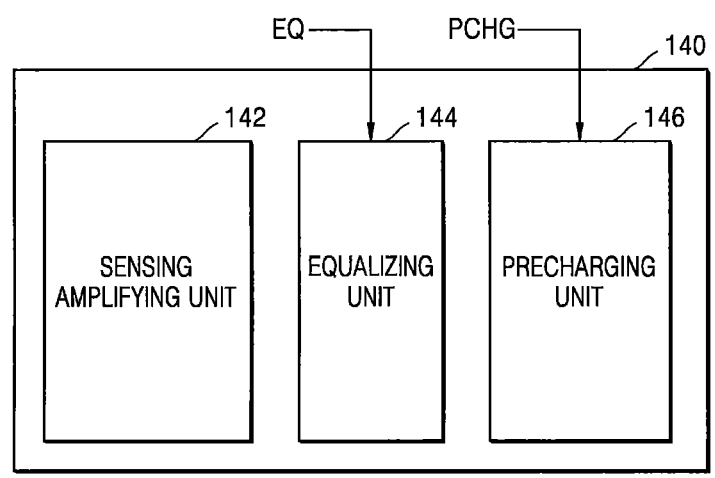
FIG. 5 is a block diagram illustrating a bit line sense amplifier according to aspects of the present disclosure.

FIG. 5 is a block diagram illustrating the bit line sense amplifier 140 according to aspects of the present disclosure. Contents of FIG. 5 overlapping with contents in FIG. 2 will be omitted.

Referring to FIGS. 2 and 5, the bit line sense amplifier 140 may include a sensing amplifier 142, an equalizer 144, and a precharger 146. The sensing amplifier 142 may sense and amplify the voltage change amount $\Delta V$ of the bit line BL. The sensing amplifier 142 may provide a voltage change amount $\Delta V$ between the bit line BL and the complementary bit line through the charge sharing, and amplify a voltage difference by developing the provided voltage change amount $\Delta V$. To this end, the sensing amplifier 142 may include at least one transistor.

The equalizer 144 may connect the bit line BL with the complementary bit line based on the equalizing signal EQ received from the precharge manager 120. Accordingly, the bit line BL and the complementary bit line may have the same voltage level. The equalizer 144 may include at least one transistor to connect the bit line BL with the complementary bit line.

The precharger 146 may apply the precharge voltage to the bit line BL and the complementary bit line based on the precharge signal PCHG received from the precharge manager 120. The precharger 146 may include at least one transistor to connect the bit line BL and the complementary bit line with the precharge voltage source.

In some embodiments, the precharger 146 may include a first precharger to receive a first precharge signal and a second precharger to receive a second precharge signal, and the first precharge signal and the second precharge signal may be independently received via separate lines. This will be described later with reference to FIG. 8 and the like.

According to the inventive concepts of the present disclosure, the equalizer 144 and the precharger 146 may independently receive the equalizing signal EQ and the precharge signal PCHG via separate lines, respectively, and may be independently controlled based on the received equalizing signal EQ and the received signal PCHG, respectively. Accordingly, applying the voltage which causes the gate leakage current may be reduced and thus, the gate leakage current may be reduced.

Figure 6:
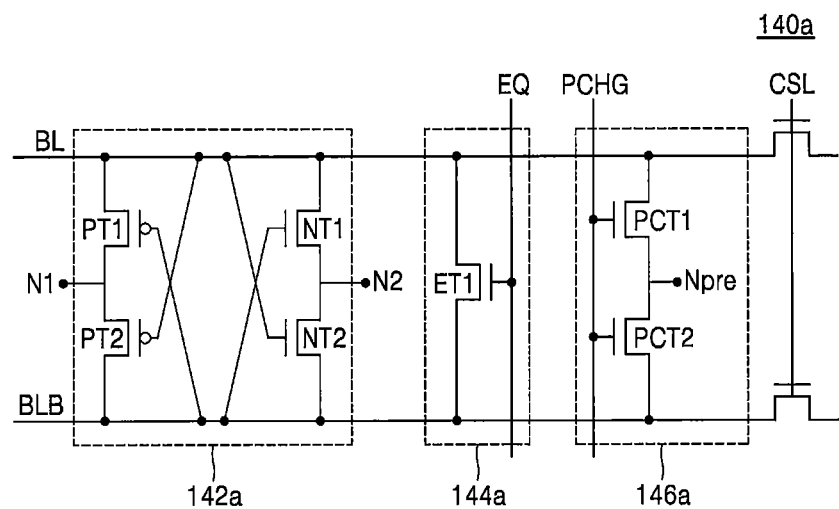
FIG. 6 is a circuit illustrating a bit line sense amplifier according to aspects of the present disclosure.

According to some embodiments of the present disclosure, and as seen in FIG. 6, the equalizer 144 and the precharger 146 may be between the sensing amplifier 142 and a column select line CSL to select the bit line BL. According to some embodiments of the present disclosure, the column select line may be between the equalizer 144 and the sensing amplifier 142.

FIG. 6 is a circuit illustrating a bit line sense amplifier 140a according to aspects of the present disclosure. Contents of FIG. 6 overlapping with contents in FIG. 5 will be omitted.

Referring to FIG. 6, the bit line sense amplifier 140a may include a sensing amplifier 142a, an equalizer 144a, and a precharger 146a. The sensing amplifiers 142a may be connected to the bit line BL and a complementary bit line BLB, and may receive voltages via a first node N1 and a second node N2. In one example, a power supply voltage VDD may be applied to the first node N1 and a ground voltage GND may be applied to the second node N2.

The sensing amplifier 142a may include a first n-type metal-oxide-semiconductor (NMOS) transistor NT1, a second NMOS transistor NT2, a first p-type metal-oxide-semiconductor (PMOS) transistor PT1, and a second PMOS transistor PT2. The first NMOS transistor NT1 may be connected between the bit line BL and the second node N2, and a gate of the first NMOS transistor NT1 may be connected to the complementary bit line BLB. Accordingly, the first NMOS transistor NT1 may control current between the bit line BL and the second node N2 based on a voltage change of the complementary bit line BLB. The first NMOS transistor NT1 may apply a voltage applied to the second node N2 (for example, the ground voltage GND) to the bit line BL based on the voltage change of the complementary bit line BLB.

The second NMOS transistor NT2 may be connected between the complementary bit line BLB and the second node N2, and a gate of the second NMOS transistor NT2 may be connected to the bit line BL. Accordingly, the second NMOS transistor NT2 may control the current between the complementary bit line BLB and the second node N2 based on the voltage change of the bit line BL. The second NMOS transistor NT2 may apply a voltage applied to the second node N2 (for example, the ground voltage GND) to the complementary bit line BLB based on the voltage change of the bit line BL.

The first PMOS transistor PT1 may be connected between the bit line BL and the first node N1, and the gate of the first PMOS transistor PT1 may be connected to the complementary bit line BLB. Accordingly, the first NMOS transistor NT1 may control current between the bit line BL and the first node N1 based on a voltage change of the complementary bit line BLB. The first NMOS transistor NT1 may apply a voltage applied to the first node N1 (for example, the power voltage VDD) to the bit line BL based on the voltage change of the complementary bit line BLB.

The second PMOS transistor PT2 may be connected between the bit line BL and the first node N1, and the gate of the second PMOS transistor PT2 may be connected to the bit line BL. Accordingly, the second NMOS transistor NT2 may control the current between the complementary bit line BLB and the first node N1 based on the voltage change of the bit line BL. The second NMOS transistor NT2 may apply a voltage applied to the second node N1 (for example, the power voltage VDD) to the complementary bit line BLB based on the voltage change of the bit line BL.

The equalizer 144a may include a first equalizing transistor ET1. The first equalizing transistor ET1 may be connected between the bit line BL and the complementary bit line BLB, and the equalizing signal EQ may be applied to the gate of the first equalizing transistor ET1. The first equalizing transistor ET1 may switch between the bit line BL and the complementary bit line BLB based on the equalizing signal EQ, and equalizing may be performed in which the bit line BL and the complementary bit line BLB are connected to each other so as to form the same voltage level. According to the inventive concepts of the present disclosure, the gate leakage current provided from the first equalizing transistor ET1 may be reduced as the equalizing signal EQ is shifted to the logic low level after the equalizing is complete.

The precharger 146a may include a first precharge transistor PCT1 and a second precharge transistor PCT2. The first precharge transistor PCT1 may be connected between the bit line BL and a precharge node Npre, and the second precharge transistor PCT2 may be connected between the complementary bit line BLB and the precharge node Npre. In addition, the precharge signal PCHG may be applied to both gates of the first precharge transistor PCT1 and the second precharge transistor PCT2. The first precharge transistor PCT1 and the second precharge transistor PCT2 may perform the precharging when a precharge voltage (for example, a half of the power source VDD, that is, VDD/2) applied to the precharge node Npre based on the precharge signal PCHG is applied to the bit line BL and the complementary bit line BLB, respectively. According to the inventive concepts of the present disclosure, since the precharge signal PCHG has a low voltage level, the gate leakage current may be reduced that occurs in the first precharge transistor PCT1 and the second precharge transistor PCT2.

Figure 7:
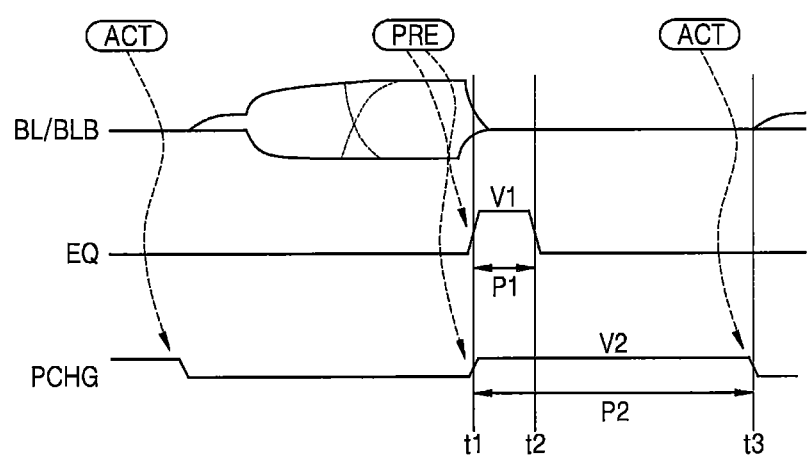
FIG. 7 is a timing diagram illustrating an operation of a bit line sense amplifier according to aspects of the present disclosure.

FIG. 7 is a timing diagram illustrating an operation of the bit line sense amplifier 140a according to aspects of the present disclosure.

Referring to FIGS. 2, 6, and 7, the precharge manager 120 may transit the precharge signal PCHG to the logic low level in response to the command ACT received from a central processing unit (for example, 20 in FIG. 1), and the bit line sense amplifier 140 may amplify the voltage levels of the bit line BL and the complementary bit line BLB.

When the read or write operation for the memory cell array 160 is completed at a first time point t1, the precharge manager 120 may shift the equalizing signal EQ to a first voltage level V1 in response to the precharge command PRE received from the central processing unit 20, and may shift the precharge signal PCHG to a second voltage level V2. According to the inventive concepts of the present disclosure, the second voltage level V2 may be less than the first voltage level V1. According to the inventive concepts of the present disclosure, since the precharge signal PCHG has the second voltage level V2 less than the first voltage level V1 when the precharging is performed, an unnecessary high voltage may not be applied to the precharger 146a, and thus, the gate leakage current provided from the precharge transistors PCT1 and PCT2 may be reduced.

The precharge manager 120 may shift the equalizing signal EQ to the logic low level at a second time point t2 when a first period P1 has elapsed in which the equalizing for the bit line BL and the complementary bit line BLB is complete. According to the inventive concepts of the present disclosure, as the precharge manager 120 shifts the equalizing signal EQ to the logic low level after the equalizing is complete, an unnecessary voltage may not be applied to the equalizer 144a after the second time t2, and thus, the gate leakage current provided from the equalizing transistor ET1 may be reduced. According to some embodiments of the present disclosure, the first period P1 in which the equalizing is complete may be adjusted in advance. When the active command ACT is received at a third time point t3 after the second period P2, the precharge manager 120 may shift the precharge signal PCHG to the logic low level. According to some embodiments of the present disclosure, the first period P1 may be shorter than the second period P2.

Figure 8:
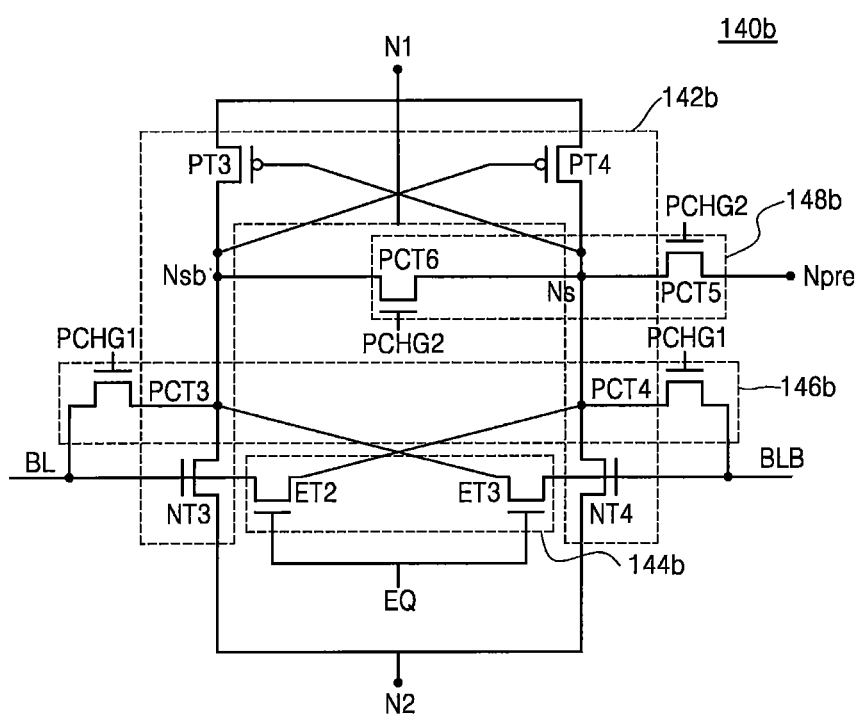
FIG. 8 is a circuit illustrating a bit line sense amplifier according to aspects of the present disclosure.

FIG. 8 is a circuit illustrating a bit line sense amplifier 140b according to aspects of the present disclosure. Contents of FIG. 8 overlapping with contents in FIG. 5 will be omitted.

Referring to FIG. 8, the bit line sense amplifier 140b may include a sensing amplifier 142b, an equalizer 144b, a first precharger 146b, and a second precharger 148b.

The sensing amplifier 142b may be connected to the bit line BL and the complementary bit line BLB, and receive voltages via the first node N1 and the second node N2. In one example, the power supply voltage VDD may be applied to the first node N1 and the ground voltage GND may be applied to the second node N2.

The sensing amplifier 142b may include a third NMOS transistor NT3, a fourth NMOS transistor NT4, a third PMOS transistor PT3, and a fourth PMOS transistor PT4. The third NMOS transistor NT3 may be connected between the complementary sensing node Nsb and the second node N2, and the gate of the third NMOS transistor NT3 may be connected to the bit line BL. Accordingly, the third NMOS transistor NT3 may control the current between the complementary sensing node Nsb and the second node N2 based on the voltage change of the bit line BL. The third NMOS transistor NT3 may apply a voltage applied to the second node N2 (for example, the ground voltage GND) to the complementary sensing node Nsb based on the voltage change of the bit line BL.

The fourth NMOS transistor NT4 may be connected between the sensing node Ns and the second node N2, and a gate of the fourth NMOS transistor NT4 may be connected to the complementary bit line BLB. Accordingly, the fourth NMOS transistor NT4 may control the current between the sensing node Ns and the second node N2 based on the voltage change of the complementary bit line BLB. The fourth NMOS transistor NT4 may apply a voltage applied to the second node N2 (for example, the ground voltage GND) to the sensing node Ns based on the voltage change of the complementary bit line BLB.

The third PMOS transistor PT3 may be connected between the complementary sensing node Nsb and the first node N1, and a gate of the third PMOS transistor PT3 may be connected to the sensing node Ns. Accordingly, the third PMOS transistor PT3 may control the current between the complementary sensing node Nsb and the first node N1 based on the voltage change of the sensing node Ns. The third PMOS transistor PT3 may apply a voltage applied to the first node N1 (for example, the power supply voltage VDD) to the complementary sensing node Nsb based on the voltage change of the sensing node Ns.

The fourth PMOS transistor PT4 may be connected between the sensing node Ns and the first node N1, and the gate of the fourth PMOS transistor PT4 may be connected to the complementary sensing node Nsb. Accordingly, the fourth PMOS transistor PT4 may control the current between the sensing node Ns and the first node N1 based on the voltage change of the complementary sensing node Nsb. The fourth PMOS transistor PT4 may apply a voltage applied to the first node N1 (for example, the power supply voltage VDD) to the sensing node Ns based on the voltage change of the complementary sensing node Nsb.

The equalizer 144b may include a second equalizing transistor ET2 and a third equalizing transistor ET3. The second equalizing transistor ET2 may be connected between the bit line BL and the sensing node Ns, the third equalizing transistor ET3 may be connected between the complementary bit line BLB and the complementary sensing node Nsb, and the equalizing signal EQ may be applied to the gates of the second equalizing transistor ET2 and the third equalizing transistor ET3. The second equalizing transistor ET2 may switch between the bit line BL and the sensing node Ns based on the equalizing signal EQ, and the third equalizing transistor ET3 may switch between the complementary bit line BL and the complementary sensing node Nsb.

The first precharger 146b may include a third precharge transistor PCT3 and a fourth precharge transistor PCT4. The third precharge transistor PCT3 may be connected between the bit line BL and the complementary sensing node Nsb, and the fourth precharge transistor PCT4 may be connected between the complementary bit line BLB and the sensing node Ns. In addition, a first precharge signal PCHG1 may be applied to the gates of the third precharge transistor PCT3 and the fourth precharge transistor PCT4. The third precharge transistor PCT3 may switch between the bit line BL and the complementary sensing node Nsb based on the first precharge signal PCHG1, and the fourth precharge transistor PCT4 may switch between the bit line BL and the complementary sensing node Nsb based on the signal PCHG1.

In some embodiments, in order to perform the equalizing for the bit line sense amplifier 140b, not only the equalizer 144b but also the first precharger 146b may need to be driven. As the second equalizing transistor ET2 and the third equalizing transistor ET3 are switched to an ON state by the equalizing signal EQ, and the third precharge transistor PCT3 and the third precharge transistor PCH3 are switched to the ON state by the first precharge signal PCHG1, the bit line BL and the complementary bit line BLB may be connected to each other. As a result, the equalizing for the bit line BL and the complementary bit line BLB may be performed.

According to the inventive concepts of the present disclosure, as the equalizing signal EQ is shifted to the logic low level and the first precharge signal PCHG1 is shifted to a lower voltage level after the equalizing is complete, the gate leakage current may be reduced that occurs from transistors (for example, ET2, ET3, PCT3, and PCT4) performing the equalizing.

The second precharger 148b may include a fifth precharge transistor PCT5 and a sixth precharge transistor PCT6. The fifth precharge transistor PCT5 may be connected between the precharge node Npre and the sensing node Ns, and the sixth precharge transistor PCT6 may be connected between the sensing node Ns and the complementary sensing node Nsb. In addition, the second precharge signal PCHG2 may be applied to the gates of the fifth precharge transistor PCT5 and the sixth precharge transistor PCT6. In some embodiments, as the second precharge signal PCHG2 is received via a separate line from the first precharge signal PCHG1, the first precharge signal PCHG1 and the second precharge signal PCHG2 may be independently controlled. The fifth precharge transistor PCT5 may switch between the sensing node Ns and the precharge node Npre based on the second precharge signal PCHG2, and the sixth precharge transistor PCT6 may switch between the sensing node Ns and the complementary sensing node Nsb based on the second precharge signal PCHG2.

In some embodiments, the first precharger 146b and the second precharger 148b may need to be driven together to perform the precharging on the bit line sense amplifier 140b. As the third precharge transistor PCT3 and the fourth precharge transistor PCT4 are switched to the ON state by the first precharge signal PCHG1, and the transistor PCT5 and the sixth precharge transistor PCT6 are switched to the ON state by the second precharge signal PCHG2, the bit line BL, the complementary bit line BLB, and the precharge node Npre may be electrically connected to each other. As a result, the precharge voltage may be applied to the bit line BL and the complementary bit line BLB, and the precharging may be performed.

According to the inventive concepts of the present disclosure, since the first precharge signal PCHG1 and the second precharge signal PCHG2 maintain the low voltage level and perform the precharging after the equalizing is complete, the gate leakage current from the transistors (for example, PCT3, PCT4, PCT5, and PCT6) performing the precharging may be reduced.

Figure 9A:
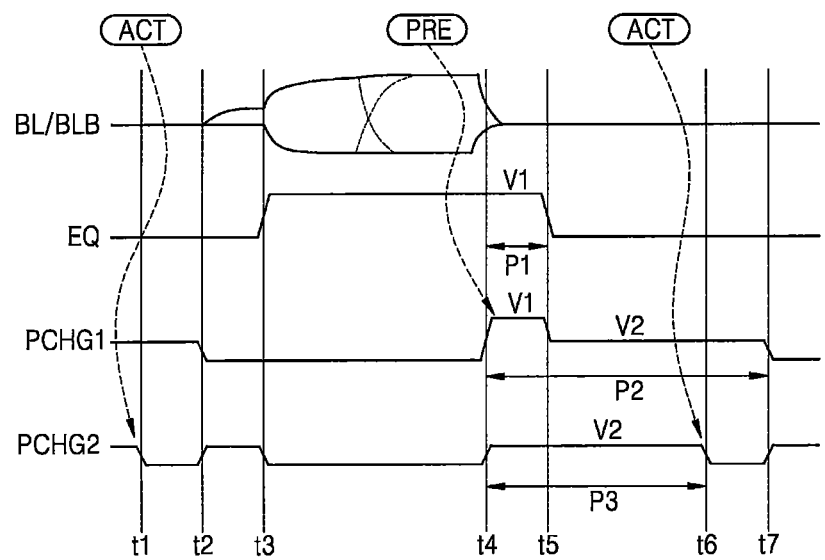
FIG. 9A is a timing diagram illustrating an operation of a bit line sense amplifier according to aspects of the present disclosure.

FIG. 9A is a timing diagram illustrating an operation of the bit line sense amplifier 140b of FIG. 8, according to aspects of the present disclosure.

Referring to FIGS. 2, 8, and 9A, the precharge manager 120 may shift the second precharge signal PCHG2 to the logic low level at the first time point t1 in response to the active command ACT received from a central processing unit (for example, 20 in FIG. 1). In some embodiments, offset cancellation may be performed in an interval between the first time point t1 and the second time point t2. As the precharge manager 120 shifts the first precharge signal PCHG1 to the logic low level at the second time point t2 after the offset cancellation is complete, and shifts the second precharge signal PCHG2 to a logic high level, the precharge manager 120 may change the voltage levels of the line BL and the complementary bit line BLB. At the third time point t3, as the precharge manager 120 shifts the equalizing signal EQ to the first voltage level V1 and the second precharge signal PCHG2 to the logic low level, the precharge manager 120 may amplify the bit line BL and the complementary bit line BLB.

When the read or write operation for the memory cell array 160 is complete at the fourth time point t4, the precharge manager 120 may, in response to the precharge command PRE received from the central processing unit 20, shift the first precharge signal PCHG1 to the first voltage level V1 and the second precharge signal PCHG2 to the second voltage level V2. According to the inventive concepts of the present disclosure, the second voltage level V2 may be less than the first voltage level V1. According to the inventive concepts of the present disclosure, since the second precharge signal PCHG2 has the second voltage level V2 less than the first voltage level V1 when the precharging is performed, an unnecessary high voltage may not be applied to the second precharger 148b and thus, the gate leakage current from the precharge transistors PCT5 and PCT6 may be reduced.

At the fifth time point t5 when the first period P1, during which the equalizing for the bit line BL and the complementary bit line BLB is complete, is over, the precharge manager 120 may shift the equalizing signal EQ to the logic low level and the first precharge signal PCHG1 to the second voltage level V2. According to the inventive concepts of the present disclosure, as the precharge manager 120 shifts the equalizing signal EQ to the logic low level and shifts the first precharge signal PCHG1 to the second voltage level V2 after the equalizing is complete, a comparatively low voltage may be applied to the equalizer 144b and the first precharger 146b after the fifth time point t5, and accordingly, the gate leakage current from the transistors (for example, ET2, ET3, PCT3, and PCT4) performing the equalizing may be reduced. According to some embodiments of the present disclosure, the first period P1 in which the equalizing is complete may be adjusted in advance. When the active command ACT is received at the sixth time point t6, the precharge manager 120 may perform the offset cancellation by shifting the second precharge signal PCHG2 to the logic low level.

According to some embodiments of the present disclosure, a second period P2 during which the first precharge signal PCHG1 is maintained at the logic high level, and a third period P3 during which the second precharge signal PCHG2 is maintained at the logic high level may be shorter than the first period P1 during which the equalizing signal EQ is maintained at the logic high level.

Figure 9B:
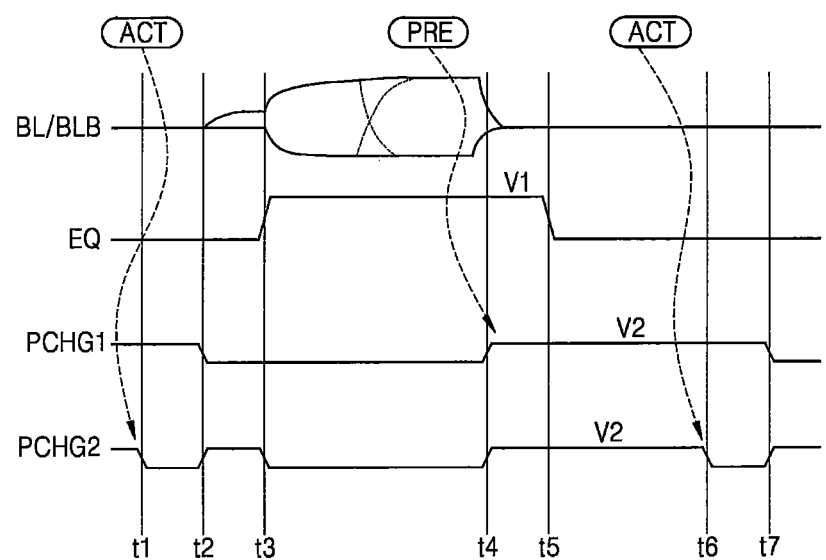
FIG. 9B is a timing diagram illustrating an operation of a bit line sense amplifier according to aspects of the present disclosure.

FIG. 9B is a timing diagram illustrating an operation of the bit line sense amplifier 140b of FIG. 8 according to aspects of the present disclosure. The embodiment of FIG. 9B is different from the embodiment of FIG. 9A in a point that the first precharge signal PCHG1 is maintained at the second voltage level V2, not at the first voltage level V1, from the fourth time point t4 to the fifth time point t5. Thus, only the differences will be described below.

Referring to FIGS. 8 and 9B, the first precharge signal PCHG1 may have the second voltage level V2 from the fourth time point t4 to the fifth time point t5 during which the equalizing is performed. The first precharge signal PCHG1 may perform the equalizing by applying the second voltage level V2 to the third precharge transistor PCT3 and the fourth precharge transistor PCT4 to shift them to the ON state. According to some embodiments of the present disclosure, the equalizing may be performed without a three-step voltage level control, that is, the first voltage level V1—the second voltage level V2—the ground voltage GND level control for the first precharge signal PCHG1.

Figure 10:
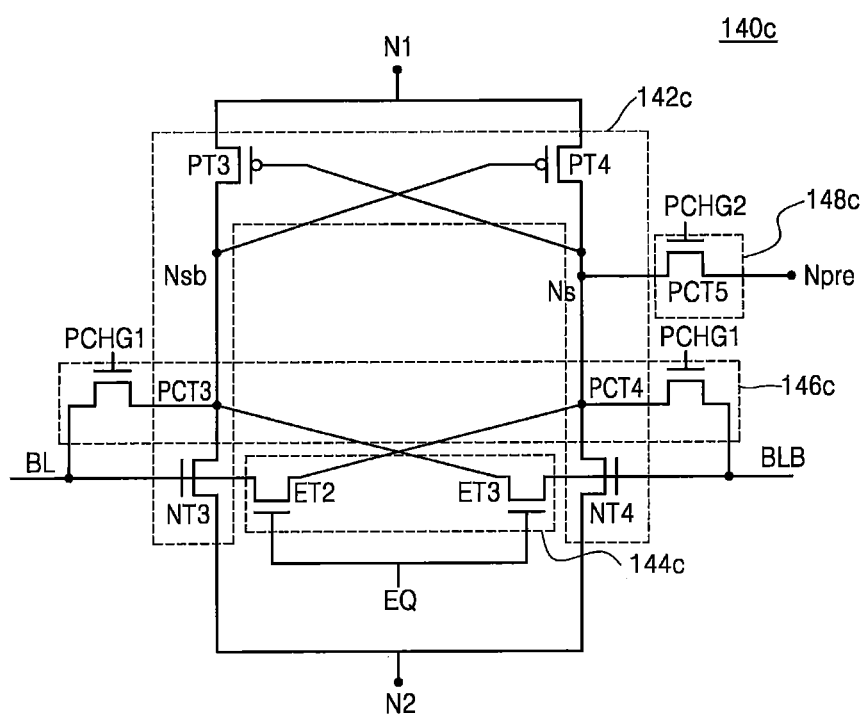
FIG. 10 is a circuit illustrating a bit line sense amplifier according to aspects of the present disclosure.

FIG. 10 is a circuit illustrating a bit line sense amplifier 140c according to aspects of the present disclosure. The bit line sense amplifier 140c of FIG. 10 is different from the bit line sense amplifier 140b of FIG. 8 only in a point that the bit line sense amplifier 140c does not have the sixth precharge sensing node PCT6 connecting the sensing node Ns with the complementary sensing node Nsb. Thus, only the differences will be described below.

Referring to FIGS. 2 and 10, the bit line sense amplifier 140c may include a sensing amplifier 142c, an equalizer 144c, a first precharger 146c, and a second precharger 148c.

In order to perform the equalizing for the bit line sense amplifier 140c, both the equalizer 144c and the first precharger 146c may need to be driven together. As the second equalizing transistor ET2 and the third equalizing transistor ET3 are switched to the ON state by the equalizing signal EQ, and the third precharge transistor PCT3 and the third precharge transistor PCH3 are switched to the ON state by the first precharge signal PCHG1, the bit line BL and the complementary bit line BLB may be connected to each other. As a result, the equalizing for the bit line BL and the complementary bit line BLB may be performed.

In order to perform the precharging on the bit line sense amplifier 140c, the equalizer 144c, the first precharger 146c, and the second precharger 148c may need to be driven together. As the fifth precharge transistor PCT5 is switched to the ON state by the second precharge signal PCHG2 and the fourth precharge transistor PCT4 is switched to the ON state by the first precharge signal PCHG1, the complementary bit line BLB may be precharged to the precharge voltage. In addition, as the fifth precharge transistor PCT5 is switched to the ON state by the second precharge signal PCHG2 and the second equalizing transistor ET2 is switched to the ON state by the equalizing signal EQ, the bit line BL may be precharged to the precharge voltage.

According to the inventive concepts of the present disclosure, since the first precharge signal PCHG1 and the second precharge signal PCHG2 are maintained at low voltage levels and perform the precharging after the equalizing is complete, the gate leakage current from the transistors (for example, PCT3, PCT4, PCT5, and PCT6) performing the precharging may be reduced.

Figure 11A:
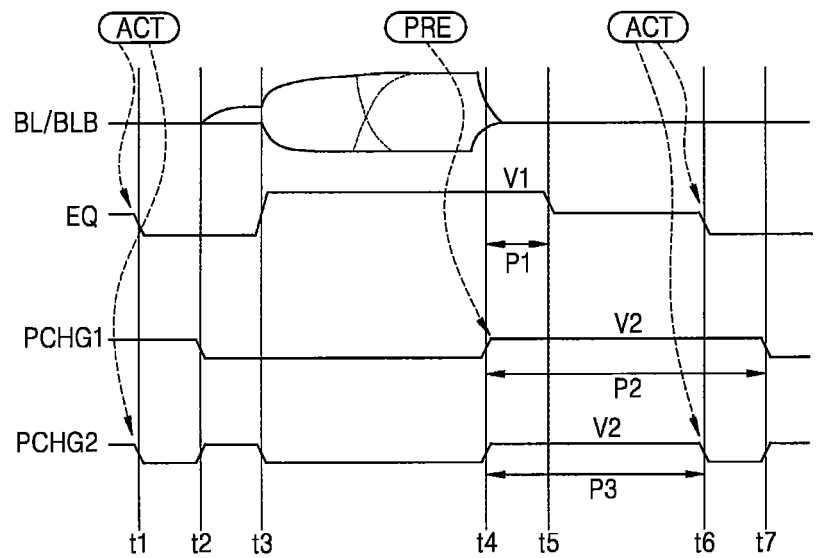
FIG. 11A is a timing diagram illustrating an operation of a bit line sense amplifier according to aspects of the present disclosure.

FIG. 11A is a timing diagram illustrating an operation of the bit line sense amplifier 140c of FIG. 10 according to aspects of the present disclosure.

Referring to FIGS. 2, 10, and 11A, the precharge manager 120, at the first time point t1, may shift the equalizing signal EQ and the second precharge signal PCHG2 to the logic low levels in response to the active command ACT received from a central processing unit (for example, 20 in FIG. 1). In some embodiments, the offset cancellation may be performed in an interval between the first time point t1 and the second time point t2. As the precharge manager 120 shifts the first precharge signal PCHG1 to the logic low level at the second time point t2 after the offset cancellation is complete, and shifts the second precharge signal PCHG2 to the logic high level, the precharge manager 120 may change the voltage levels of the line BL and the complementary bit line BLB. At the third time point t3, as the precharge manager 120 shifts the equalizing signal EQ to the first voltage level V1 and the second precharge signal PCHG2 to the logic low level, the precharge manager 120 may amplify the voltage levels of the bit line BL and the complementary bit line BLB.

When the read or write operation for the memory cell array 160 is complete at the fourth time point t4, the precharge manager 120 may, in response to the precharge command PRE received from the central processing unit 20, shift the first precharge signal PCHG1 to the first voltage level V1 and the second precharge signal PCHG2 to the second voltage level V2. According to the inventive concepts of the present disclosure, the second voltage level V2 may be less than the first voltage level V1. According to the inventive concepts of the present disclosure, as the first precharge signal PCHG1 and the second precharge signal PCHG2 have the second voltage level V2 less than the first voltage level V1 when the precharging is performed, an unnecessary high voltage may not be applied to the first precharger 146c and the second precharger 148c, and thus, the gate leakage current from the precharge transistors PCT3, PCT4, PCT5, and PCT6 may be reduced.

At the fifth time point t5 when the first period P1 for the equalizing for the bit line BL and the complementary bit line BLB is over, the precharge manager 120 may shift the equalizing signal EQ to the second voltage Level V2. According to the inventive concepts of the present disclosure, as the precharge manager 120 shifts the equalizing signal EQ to the second voltage level V2 after the equalizing is complete, an unnecessary voltage may not be applied to the equalizer 144c, and thus, the gate leakage current from the transistors ET2 and ET3 performing the equalizing may be reduced. According to some embodiments of the present disclosure, the first period P1 in which the equalizing is complete may be adjusted in advance. When the active command ACT is received at the sixth time point t6, the precharge manager 120 may perform the offset cancellation by shifting the equalizing signal EQ and the second precharge signal PCHG2 to the logic low levels.

According to aspects of the present disclosure, a second period P2 during which the first precharge signal PCHG1 is maintained at the logic high level, and a third period P3 during which the second precharge signal PCHG2 is maintained at the logic high level may be shorter than the first period P1 during which the equalizing signal EQ is maintained at the logic high level.

Figure 11B:
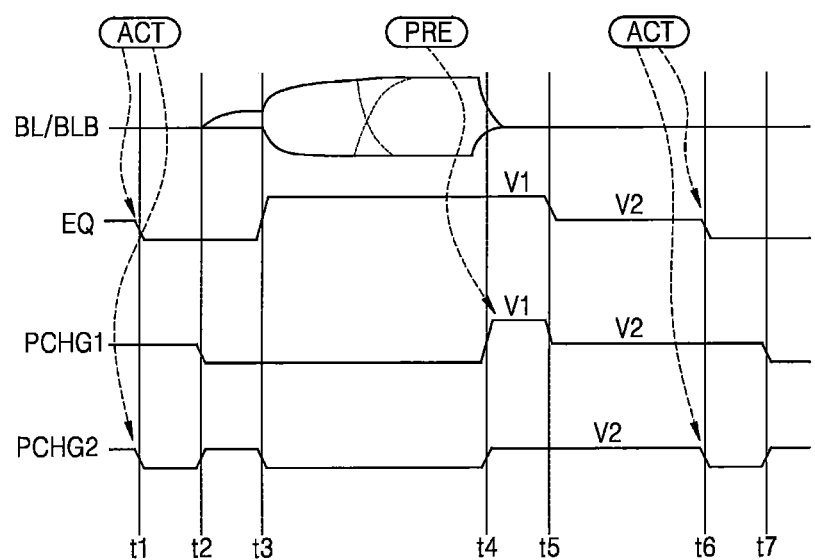
FIG. 11B is a timing diagram illustrating an operation of a bit line sense amplifier according to aspects of the present disclosure.

FIG. 11B is a timing diagram illustrating an operation of the bit line sense amplifier 140c of FIG. 10 according to aspects of the present disclosure. An embodiment of FIG. 11B is different from the embodiment of FIG. 11A in a point that the first precharge signal PCHG1 is maintained at the first voltage level V1, not at the second voltage level V2, from the fourth time point t4 to the fifth time point t5. Thus, only the differences will be described below.

Referring to FIGS. 10 and 11B, the precharge manager 120 may shift the first precharge signal PCHG1 to the first voltage level V1 in response to the precharge command PRE. After the equalizing is complete, the precharge manager 120 may shift the equalizing signal EQ and the first precharge signal PCHG1 to the second voltage level V2. According to aspects of the present disclosure, since the first precharge signal PCHG1 is maintained at the first voltage level V1 from the fourth time point t4 to the fifth time point t5 during which the equalizing is performed, the equalizing may be performed faster. The precharge manager 120 may shift the equalizing signal EQ and the first precharge signal PCHG1 to the second voltage level V2 after the equalizing is complete, and accordingly, after the fifth time point t5, an unnecessary voltage may not be applied to the equalizer 144c. Thus, gate leakage currents from the transistors (for example, ET2, ET3, PCT3, and PCT4) performing the equalizing may be reduced.

Figure 12:
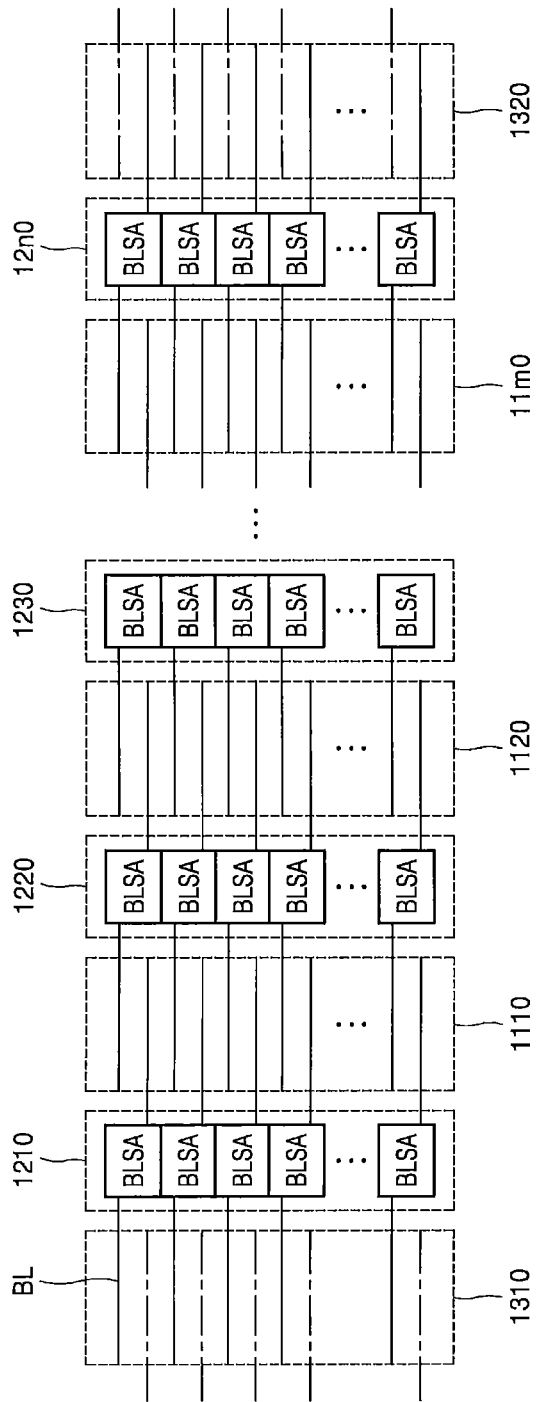
FIG. 12 is a diagram illustrating a memory device to which a bit line sense amplifier is applied according to aspects of the present disclosure.

FIG. 12 is a diagram illustrating a memory device 1000 to which a bit line sense amplifier is applied according to aspects of the present disclosure.

Referring to FIG. 12, the memory device 1000 may include a plurality of memory cell arrays 1110 through 11m0 (m is an integer of 2 or more), a plurality of bit line sense amplifier sub-units 1210 through 12n0 (n is an integer of 2 or more), and dummy arrays 1310 and 1320. The plurality of bit line pairs BL and BLB connected to the plurality of memory cell arrays 1110 through 11m0 may be connected to a plurality of bit line sense amplifiers BLSA, respectively. The plurality of bit line sense amplifiers BLSA may be the bit line sense amplifiers described with reference to FIGS. 1 through 11B.

The memory device 1000 including the plurality of bit line sense amplifiers BLSA may independently receive an equalizing signal, a first precharge signal, and a second precharge signal via separate lines, and based on the received signals, the gate leakage current of the transistors included in the plurality of bit line sense amplifiers BLSA may be reduced.

Figure 13:
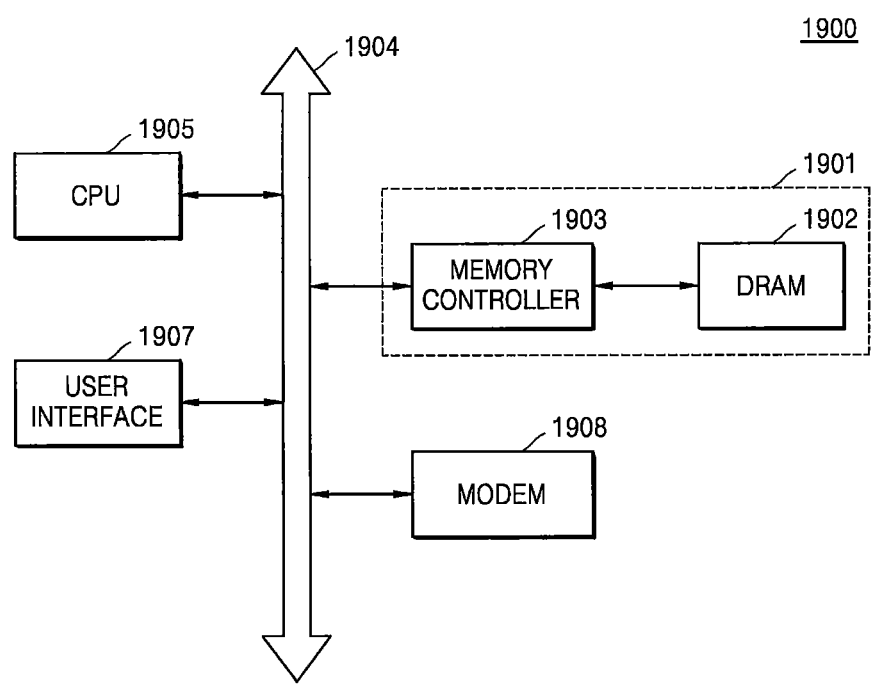
FIG. 13 is a block diagram illustrating a computer system according to aspects of the present disclosure.

FIG. 13 is a block diagram illustrating a computer system 1900 according to an aspects of the present disclosure.

Referring to FIG. 13, the computer system 1900 may be embodied in a mobile device, a desk top computer, or the like. The computer system 1900 may include a DRAM memory system 1901, a central processing unit (CPU) 1905, a user interface 1907, and a modem 1908 such as a baseband chipset, which are electrically connected to a system bus 1904. The computer system 1900 may further include an application chipset, a camera image processor (CIS), an input/output device, and the like, which are not illustrated in FIG. 13.

The user interface 1907 may be an interface to transmit data to or receive data from a communication network. The user interface 1907 may be in a wired or wireless form and may include an antenna, a wired or wireless transceiver, or the like. Data provided via the user interface 1907 or the modem 1908 or data processed by the central processing unit 1905 may be stored in the DRAM memory system 1901.

The DRAM memory system 1901 may include the memory system described above with reference to FIGS. 1 through 12. The DRAM memory system 1901 may include a DRAM 1902 and a memory controller 1903. The DRAM 1902 may store data processed by the central processing unit 1905 or data input from the outside. The DRAM 1902 may output to a bit line sense amplifier an equalizing signal, a first precharge signal, and a second precharge signal that are received via separate lines, based on a precharge command received from the memory controller 1903 or the central processing unit 1905, and based on this output signals, the gate leakage current may be reduced as the equalizing and the precharging are performed.

When the computer system 1900 is a device that performs wireless communication, the computer system 1900 may be used in a communication system such as code division multiple access (CDMA), global system for mobile communication GSM), North American multiple access (NAMS), and CDMA 2000. The computer system 1900 may be embodied in an information processing apparatus such as a personal digital assistant (PDA), a portable computer, a web tablet, a digital camera, a portable media player (PMP), a mobile phone, a wireless phone, a lap-top computer, or the like.

As described above, example embodiments have been disclosed in the drawings and specification. While the example embodiments have been described herein with reference to specific terms, it should be understood that they have been used only for the purpose of describing the inventive concepts of the present disclosure and not for limiting the scope of the present disclosure as defined in the claims. Therefore, it will be clearly understood by one of ordinary skill in the art that various modifications and equivalent embodiments are possible without departing from the scope of the present disclosure. Accordingly, the true scope of the present disclosure should be determined by the inventive concepts of the following claims.

What is claimed is:

1. A memory circuit connected to a bit line and a complementary bit line and configured to perform precharging on the bit line and the complementary bit line, the memory circuit comprising:
    an equalizer configured to equalize voltage levels of the bit line and the complementary bit line by connecting the bit line with the complementary bit line in response to an equalizing signal received via a first line; and
    a precharger configured to precharge the bit line and the complementary bit line to a precharge voltage in response to a precharge signal received via a second line separate from the first line,
    wherein the equalizing signal is maintained at a first voltage level until the bit line and the complementary bit line reach an identical voltage level due to the equalizing, and wherein the precharge signal is maintained at a second voltage level lower than the first voltage level until an active command for the bit line and the complementary bit line is received.

2. The memory circuit of claim 1, wherein the equalizer is connected between the bit line and the complementary bit line and comprises a first equalizing transistor controlled by the equalizing signal; and wherein the precharger comprises a first precharge transistor connected between the bit line and a precharge voltage node and controlled by the precharge signal, and wherein the precharger further comprises a second precharge transistor connected between the complementary bit line and the precharge voltage node and controlled by the precharge signal.

3. The memory circuit of claim 1, further comprising a sensing amplifier connected between the bit line and the complementary bit line, the sensing amplifier configured to sense a voltage change of the bit line and a voltage change of the complementary bit line and adjust a voltage of a sensing node based on the sensed voltage changes,
    wherein the sensing amplifier comprises:
    a first n-type metal-oxide-semiconductor (NMOS) transistor connected between a complementary sensing node and a first node, and controlled by the voltage change of the bit line,
    a second NMOS transistor connected between the sensing node and the first node, and controlled by the voltage change of the complementary bit line,
    a first p-type metal-oxide-semiconductor (PMOS) transistor connected between the complementary sensing node and a second node, and controlled by the adjusted voltage change of the sensing node, and
    a second PMOS transistor connected between the sensing node and the second node, and controlled by the voltage change of the complementary bit line.

4. The memory circuit of claim 3, wherein the precharger comprises a first precharger controlled by a first precharge signal and a second precharger controlled by a second precharge signal, and wherein the first precharge signal and the second precharge signal are received via separate lines.

5. A memory circuit connected to a bit line and a complementary bit line and configured to perform precharging on the bit line and the complementary bit line, the memory circuit comprising:
    an equalizer configured to equalize voltage levels of the bit line and the complementary bit line by connecting the bit line with the complementary bit line in response to an equalizing signal;
    a first precharger controlled by a first precharge signal and a second precharger controlled by a second precharge signal, the first and second prechargers configured to precharge the bit line and the complementary bit line to a precharge voltage,
    a sensing amplifier connected between the bit line and the complementary bit line, the sensing amplifier configured to sense a voltage change of the bit line and a voltage change of the complementary bit line and adjust a voltage of a sensing node based on the sensed voltage changes,
    wherein the sensing amplifier comprises:
    a first n-type metal-oxide-semiconductor (NMOS) transistor connected between a complementary sensing node and a first node, and controlled by the voltage change of the bit line,
    a second NMOS transistor connected between the sensing node and the first node, and controlled by the voltage change of the complementary bit line,
    a first p-type metal-oxide-semiconductor (PMOS) transistor connected between the complementary sensing node and a second node, and controlled by the adjusted voltage change of the sensing node, and
    a second PMOS transistor connected between the sensing node and the second node, and controlled by the voltage change of the complementary bit line,
    wherein the first precharge signal, the second precharge signal, and the equalizing signal are received via separate lines, wherein the equalizer comprises a first equalizing transistor connected between the sensing node and the bit line and controlled by the equalizing signal, and a second equalizing transistor connected between the complementary sensing node and the complementary bit line and controlled by the equalizing signal, wherein the first precharger comprises a first precharge transistor connected between the bit line and the complementary sensing node and controlled by the first precharge signal, and a second precharge transistor connected between the complementary bit line and the sensing node and controlled by the first precharge signal, and wherein the second precharger comprises a third precharge transistor connected between the sensing node and the complementary sensing node and controlled by the second precharge signal, and a fourth precharge transistor connected between the sensing node and a precharge power source and controlled by the second precharge signal.

6. The memory circuit of claim 5, wherein the equalizing signal is maintained at a first voltage level from a first time point at which a precharge command for the bit line and the complementary bit line is received to a second time point at which the bit line and the complementary bit line reach an identical voltage level; wherein the first precharge signal is maintained at the first voltage level from the first time point to the second time point, and at a second voltage level less than the first voltage level from the second time point to a third time point at which an active command for the bit line and the complementary bit line is received; and wherein the second precharge signal is maintained at the second voltage level from the first time point to the third time point.

7. The memory circuit of claim 5, wherein the equalizing signal is maintained at a first voltage level from a first time point at which a precharge command for the bit line and the complementary bit line is received to a second time point at which the bit line and the complementary bit line reach an identical voltage level due to the equalizing; and wherein the first precharge signal and the second precharge signal are maintained at a second voltage level less than the first voltage level from the first time point to a third time point at which an active command for the bit line and the complementary bit line is received.

8. The memory circuit of claim 4, wherein the equalizer comprises a first equalizing transistor connected between the sensing node and the bit line and controlled by the equalizing signal, and a second equalizing transistor connected between the complementary sensing node and the complementary bit line and controlled by the equalizing signal; wherein the first precharger comprises a first precharge transistor connected between the bit line and the complementary sensing node and controlled by the first precharge signal, and a second transistor connected between the complementary bit line and the sensing node and controlled by the first precharge signal; and wherein the second precharger comprises a third precharge transistor connected between the sensing node and a precharge power source and controlled by the second precharge signal.

9. The memory circuit of claim 8, wherein the equalizing signal is maintained at a first voltage level from a first time point at which a precharge command for the bit line and the complementary bit line is received to a second time point at which the bit line and the complementary bit line reach an identical voltage level due to the equalizing, and at a second voltage level less than the first voltage level from the second time point to a third time point at which an active command for the bit line and the complementary bit line is received; and wherein the first precharge signal and the second precharge signal are maintained at the second voltage level from the first time point to the third time point.

10. The memory circuit of claim 8, wherein the equalizing signal is maintained at a first voltage level from a first time point at which a precharge command for the bit line and the complementary bit line is received to a second time point at which the bit line and the complementary bit line reach an identical voltage level due to the equalizing, and at a second voltage level less than the first voltage level from the second time point to a third time point at which an active command for the bit line and the complementary bit line is received; wherein the first precharge signal is maintained at the first voltage level from the first time point to the second time point and at the second voltage level from the second time point to the third time point; and wherein the second precharge signal is maintained at the second voltage level from the first time point to the third time point.

11. The memory circuit of claim 4, wherein the equalizer and the precharger are between the sensing amplifier and a column select line.

12. The memory circuit of claim 4, wherein a column select line is between the equalizer and the precharger.

13. A memory circuit comprising:
    a first connection to a bit line;
    a second connection to a complementary bit line;
    a first line configured to receive an equalizing signal;
    a second line separate from the first line and configured to receive a precharge signal;
    an equalizer configured to equalize voltage levels of the bit line and the complementary bit line by connecting the bit line with the complementary bit line in response to the equalizing signal; and
    a precharger configured to precharge the bit line and the complementary bit line to a precharge voltage in response to the precharge signal,
    wherein the equalizing signal is maintained at a first positive steady-state voltage level for a first duration of time until the voltage level of the bit line and the voltage level of the complementary bit line are equalized, and
    wherein the precharge signal is maintained at a second positive steady-state voltage level for a second duration of time until an active command is received, wherein the second duration of time is longer than the first duration of time and at least partially overlaps with the first duration of time.

\* \* \* \* \*